United States Patent [19]

Nakayama

[11] Patent Number: 5,535,084
[45] Date of Patent: Jul. 9, 1996

[54] SEMICONDUCTOR INTEGRATED CIRCUIT HAVING PROTECTION CIRCUITS

[75] Inventor: Osamu Nakayama, Utsunomiya, Japan

[73] Assignee: Kawasaki Steel Corporation, Hyogo, Japan

[21] Appl. No.: 95,914

[22] Filed: Jul. 23, 1993

[30] Foreign Application Priority Data

Jul. 24, 1992 [JP] Japan .................................. 4-198789

[51] Int. Cl.⁶ .............................. H01L 23/62; H02H 9/02
[52] U.S. Cl. .............................. 361/56; 257/356; 361/91; 361/111
[58] Field of Search .............................. 361/91, 56, 58, 361/111; 257/355–363

[56] References Cited

U.S. PATENT DOCUMENTS

| | | | |
|---|---|---|---|
| 4,942,317 | 7/1990 | Tanaka et al. | 307/465 |
| 4,945,395 | 7/1990 | Suehiro | 357/40 |
| 5,079,612 | 7/1992 | Takamoto et al. | 357/41 |

FOREIGN PATENT DOCUMENTS 1-289138  11/1989  Japan .

OTHER PUBLICATIONS

Robert J. Antinone, et al., "Electrical Overstress Protection for Electronic Devices", Noyes Publications, New Jersey, 1986, pp. 16–19.

*Primary Examiner*—Jeffrey A. Gaffin
*Assistant Examiner*—Michael J. Sherry
*Attorney, Agent, or Firm*—Oliff & Berridge

[57] ABSTRACT

This invention provides a semiconductor integrated circuit including protection circuits which are protective against static electricity corresponding to an area of internal cells, and are adaptable to excessive voltages generated under complicated conditions, such as ESD pulses, etc. The semiconductor integrated circuit comprises a plurality of input/output cells connected electrically in parallel to one bonding pad, and a plurality of protection circuits for decreasing excessive voltages arranged in parallel between the bonding pad and the I/O cells. The wiring patterns between the parallel-arranged protection circuits and the I/O cells are shorted together.

12 Claims, 12 Drawing Sheets

|      | C      | R1       |
|------|--------|----------|
| EIAJ | 200 PF | 0 ohm    |
| MIL  | 100 PF | 1.5 Kohm |

SEMICONDUCTOR INTEGRATED CIRCUIT HAVING PROTECTION CIRCUITS

BACKGROUND OF THE INVENTION

1. Field of the Invention

This invention relates to an integrated circuit typically exemplified by custom LSI circuits of the gate array type or other types, and more specifically to an integrated circuit having protection devices or circuits for preventing breakdown or degradation of the MOS structure due to transient phenomena, such as excessive voltage pulses or excessive current flows due to static discharges.

2. Description of Related Art

It is generally known in semiconductor integrated circuit art to provide MOS structures with protection circuit or devices for protecting input/output (I/O) cells from damage due to static electricity discharges. In recent semiconductor integrated circuits, especially in Application Specific Integrated Circuits (ASICs) typically exemplified by custom LSI circuits of the gate array type, as described in U.S. Pat. No. 4,942,317, the so-called slice type-I/O cell, in which a plurality of I/O cells (I/O buffers) are connected to one bonding pad to increase the available output current, has been increasingly used. On the other hand, a protection device or circuit for a I/O cell selectively use the following two conventional structures.

1) In the first structure, mutually compensating protection devices or circuits are arranged at opposed polar positions (to be at opposed polar positions means to be at a position on the scribe line side of a bonding pad at a position on the inside of the die on which the bonding pad is formed). The term "mutually compensating protection devices or circuits" means a combination of protection devices or circuits, one protection circuit having a protection function against, e.g., positive voltage pulses, and the other protection circuit having a protection function against negative voltage pulses.

FIG. 1 shows one example of such mutually compensating protection circuits. A first protection circuit 32a (the protection circuit A in FIG. 1) and a secondary protection circuit 33a (the protection circuit B in FIG. 1) are provided, respectively, on the input side of a bonding pad 31a and on the output side of the bonding pad 31a. The first protection circuit 32a is connected to a power bus 34a, and the secondary protection circuit 33a is connected to an internal circuit. The power bus connected to the secondary protection circuit 33a is not shown in FIG. 1. FIG. 2 shows a circuit which is equivalent to the mutually compensating protection circuits of FIG. 1, in which the first protection circuit 32a is provided by, e.g., a $p^+/n^-$ diode 32b, and the secondary protection circuit 33a is provided by, e.g., an $n^+/p^-$ diode 33b. In this arrangement, when a positive voltage with respect to ground (GND) is applied to the bonding pad 31b, the first protection circuit 32b operates forwardly to lower the voltage of the bonding pad 31b with respect to GND. When a negative voltage with respect to GND is applied to the bonding pad 31b, the secondary protection circuit 33b is biased forward to lower the voltage of the bonding pad 31b.

As one example of the protection circuits based on the same idea, FIG. 3 shows the protection circuits described in, e.g., Robert J. Antinone, "Electrical Overstress Protection for Electronic Devices", at page 19. In this circuit, a guard ring 42 is provided around a bonding pad 41. A protection circuit 43 is formed between the guard ring and an n+ diode formed on both sides of the bonding pad 41. A nearby diode 44 is an $n^+$ diffused resistor diode.

2) In the second structure, the protection circuits are not positioned in an opposed arrangement, but remain mutually compensating. As one example of such mutually compensating protection circuits, FIGS. 4 and 5 show the protection circuits described in Robert J. Antinone "Electrical Overstress Protection for Electronic Devices", at page 18. FIG. 4 is a plan view of the protection device of this circuit, as viewed from above. FIG. 5 is a cross-sectional view of the respective protection circuits. As shown in FIGS. 4 and 5, the two protection circuits 52 and 53 are not positioned in an opposing relationship with respect to the bonding pad 51. However, these protection circuits 52 and 53 also operate in a mutually compensative fashion.

SUMMARY OF THE INVENTION

This invention provides a semiconductor integrated circuit having a structure in which a plurality of I/O cells are connected electrically in parallel to a bonding pad.

This invention further provides a semiconductor integrated circuit, including protection circuits which can protect against electrical overstress in corresponding areas of respective ones of the I/O cells, and protect against transient phenomena, such as excessive voltage pulses and excessive current flows taking place under various conditions.

For example, the MIL standard method and the EIAJ method are used as standard electrostatic breakdown voltage tests. Electrostatic discharge (ESD) pulses, which are used in these tests, have various rise times and pulse widths. It is generally recognized that it is difficult to fabricate semiconductor integrated circuits which can survive these tests. This invention is based on this recognition.

FIG. 6 shows a circuit which is equivalent to a device used in the above-identified electrostatic breakdown voltage tests. FIG. 7 shows the test conditions for these tests. In the EIAJ method, because the resistor R1 has a resistance of zero (0) ohms, a relatively large current flows. Thus, breakdown takes place at a large current in a relatively short period of time. In contrast, in the MIL standard method, breakdown takes place at high voltages and at relatively large pulse widths.

In a semiconductor integrated circuit having slice type-I/O cells, as shown in FIG. 8, a plurality of I/O cells 62a–62c are electrically connected in parallel to one bonding pad 61 to obtain a large output current. To protect the ASIC having such a structure against electrical overstress, the protection circuit shown in FIG. 9 is provided. As shown in FIG. 9, a first protection circuit 74 (the protection circuit A in FIG. 9) is inserted between a bonding pad 71 and a power bus 73. In addition, a secondary protection circuit 75 (the protection circuit B in FIG. 9) is inserted between the bonding pad 71 and the I/O cells 72a–72c. A power bus connecting the secondary protection circuit 75 is not shown in FIG. 9. In this structure, when an excessive voltage pulse is applied to the inputs of the respective protection circuits 74 and 75, the potential of the excessive voltage pulse is decreased. This arrangement will be discussed.

A power supply for the bonding pad 61 is not shown in FIG. 8. As shown in FIG. 9, the bonding pad 71 is connected to the power bus 73 by the protection circuit 74. The semiconductor integrated circuit shown in FIG. 9 incorporating the protection circuits 74 and 75 has a problem, in that, when an area of the I/O cells (I/O buffers) 72a–72c is increased relative to an area of the protection circuits 74 and 75, by increasing the number of I/O cell arranged in parallel and connected through the protection circuit 75 to the bonding pad 71, the protection circuits 74 and 75 cannot provide sufficient protection against excessive voltage pulses and/or current flows. When electrostatic voltage pulses or large energy, which cannot be accommodated by a time constant of the combination of the protection circuits 74 and 75 shown in FIG. 9, are applied to the bonding pad 71, the energy cannot be sufficiently reduced. Thus, the protection circuits 74 and 75 fail to protect the I/O cells 72a–72c.

To solve the above-described problems and achieve the above-described objects, this invention provides a semiconductor integrated circuit having one of the following two structures corresponding to the preferred embodiments of this invention.

That is, the semiconductor integrated circuit having the first structure, corresponding to the first preferred embodiment, comprises a plurality of I/O cells connected electrically in parallel to each bonding pad. In addition, power supply means for the first and secondary protection circuits are not specifically limited here. A plurality of protection circuits for reducing excessive voltage pulses are arranged in parallel relative to the bonding pad and positioned between the bonding pad and the corresponding I/O cells. Furthermore, all of the wiring patterns extending between the bonding pad and the I/O cells, and connected to the protection circuits, are shorted together.

Each of the protection circuits may be the same protection circuit or a protection circuit having a different function from the other protection circuits. It is preferred that the number of protection circuits to be provided for each bonding pad be equal to the number of I/O cells connected to that bonding pad.

The protection circuits are not all essentially the same protection circuit, but are simply circuits for decreasing inputted excessive positive or negative voltage pulses. The protection circuits include switching devices having respective different operational conditions and/or device characteristics.

The shorting provided between the protection circuits, arranged in parallel between the bonding pad and the I/O cells, and the I/O cells is provided by electrically connecting together all of the wiring patterns interconnecting the protection circuits and the I/O cells with a conducting metal layer, by forming wiring patterns which themselves interconnect the respective protection circuits, or by forming a wiring layer. The protection ability of these wiring structures can be improved by decreasing the resistance of the shorting areas without increasing size of the shorting areas. These structures are especially effective when a pad pitch is below 100 μm.

The semiconductor integrated circuit having the second structure, corresponding to the second preferred embodiment, comprises a plurality of bonding pads connected in parallel to a power bus by a first plurality of protection circuits for the power supply. A plurality of I/O cells are connected electrically in parallel to each one of the plurality of bonding pads. The first plurality of protection circuits for decreasing excessive voltage pulses is arranged in parallel relative to the plurality of bonding pads between the power bus and the plurality of bonding pads. The power bus means is a bus for supplying power or is a ground bus. A second plurality of protection circuits for decreasing excessive voltage pulses is arranged in parallel relative to the plurality of bonding pads between the plurality of bonding pads and the plurality of I/O cells. Wiring patterns between ones of the second plurality of protection circuits and the plurality of I/O cells corresponding to each bonding pad are shorted together. The first plurality of protection circuits disposed between the power bus and the plurality of bonding pads are called the first protection circuits. The second plurality of protection circuits disposed between the plurality of bonding pads and the corresponding pluralities of I/O cells are called the secondary protection circuits.

In the second structure, the types of the respective protection circuits, the circuit structures of the protection circuits, and the structures for shorting the wiring patterns are the same as in the first structure.

As an application of the second structure, only the wiring patterns between the secondary protection circuits and the I/O cells may be shorted. The first protection circuits may be connected to various kinds of power busses, such as a Vcc power bus, a Vss power bus, or a GND power bus.

According to the first structure of this invention, when an excessive voltage pulse is supplied to one of the bonding pads from outside of the LSI chip, the excessive pulse voltage is sufficiently reduced by a plurality of the secondary protection circuits, which are arranged in parallel between the bonding pad and the corresponding plurality of I/O cells which are connecting to the bonding pad. Furthermore, since the wiring patterns between the corresponding secondary protection circuits and the corresponding I/O cells are shorted together, an input potential of each of the I/O cells is the same.

According to the second structure of this invention, when an excessive voltage pulse is supplied from the bonding pad, the voltage pulse is reduced by a plurality of the first protection circuits. When the voltage pulse is sufficiently protectively reduced, the voltage pulse is supplied, as reduced, to the corresponding plurality of I/O cells connected to the bonding pad. When the protection provided by the plurality of first protection circuits is not sufficient, the secondary protection circuits between the bonding pad and the I/O cells operate. Since the wiring patterns between the secondary protection circuits and the I/O cells are shorted together, the input potential of each of the respective I/O cells is the same.

Thus, this invention is characterized by a plurality of first protection circuits and a plurality of secondary protection circuits which are each arranged in parallel relative to one bonding pad, and in that wiring patterns between a bonding pad and the corresponding I/O cells are shorted together.

In the circuit shown in FIG. 10, two types of protection circuits (a protection circuit A and a protection B circuit in FIG. 10) are provided between each bonding pad and a corresponding plurality of I/O cells. In particular, the protection circuits are arranged serially, as in FIG. 11, or in parallel, as in FIG. 12. In both FIGS. 11 and 12 three I/O cells are provided for a single bonding pad, and a power supply means is not shown. The shown protection circuits are the secondary protection circuits and each secondary protection circuit has a different protection function.

However, in the structure shown in FIG. 11, in which the secondary protection circuits are serially arranged, the secondary protection circuits are arranged linearly along the flow of the input/output signals, i.e., along a propogation direction. In this case, the propagation of an ESD pulse through the respective secondary protection circuits has a time delay. Accordingly, there is a risk that pulses, which would be effectively handled by a following secondary protection circuit (on the later stage) enters a preceding secondary protection circuit and is not attenuated, and thus might break or damage the preceding secondary protection circuit.

In contrast, in the structure shown in FIG. 12, a plurality of the secondary protection circuits are arranged in parallel to the bonding pad. Thus, a distance of the electric path from the bonding pad to each of the secondary protection circuits is substantially the same. Accordingly, the propagation time of the ESD pulse to each of the secondary protection circuits will be substantially the same. The plurality of secondary protection circuits substantially uniformly operate.

Since the wiring patterns are shorted together, no problems due to delays in switching of the plurality of secondary protection circuits occur.

In this invention, the wiring patterns are provided by, as shown in FIG. 12, connecting the secondary protection circuits 74 and 75 to the bonding pad 71. However, the wiring patterns are not necessarily limited to this embodiment. Shorting the wiring patterns by a conductive metal wire 16 is effective when the wiring patterns are below 100 µm in size.

As shown in FIG. 13, one bonding pad 71 and three secondary protection circuits 74–76 are connected by a common wide wiring pattern 77. In this case, the outputs of the three secondary protection circuits 74–76 are automatically shorted. Therefore, it is not necessary to use a conducting metal wire for individually shorting the secondary protection circuits' outputs together.

Actually, the bonding pad 71, the three secondary protection circuits 74 76, and the I/O cells 72a–72c are interconnected by a common wiring pattern (with an A1 lower wiring layer). The power buses A and B (supplying Vcc or GND, and each with an upper A1 wiring layer) are formed to normally traverse the cells lying above them and are connected to the lower A1 wiring layer. Thus, a circuit is formed.

This wiring pattern has a larger delay in the wiring as the wiring width decreases. Actually, this trend is conspicuous when the wiring width is 100 µm. According to this invention, when the pad pitch of the bonding pads 71 below 100 µm, a sufficient wiring width can be secured. This invention is especially effective as in 12 when the pad pitch is below 100 µm.

This invention, according to the first and second preferred embodiments, covers as an embodiment, a structure in which a plurality of protections (both the first protection circuits and the secondary protection circuits, or the secondary protection circuits alone) are arranged in parallel and electrically connected together, and a plurality of the I/O cells are associated with the plurality of the secondary protection circuits on a one-to-one basis.

FIG. 14 shows, as a comparison example, a semiconductor integrated circuit comprising only a single secondary protection circuit 84 positioned between each bonding pad 81 and a corresponding plurality of the I/O cells 82.

This ASIC is especially designed so that six I/O cells should correspond to each bonding pad 81. Each I/O cell 82 has an allowable current of 3 mA. Each bonding pad 81 is supplied with a total of allowable current for the corresponding I/O cells 82, which are electrically connected in parallel to the secondary protection circuit 84. For example, when three of the I/O cells 82 are connected in parallel to one bonding pad 81, a 9 mA current is supplied to that bonding pad 81.

Since a number of the I/O cells 82 which are connected in parallel to one bonding pad 81 varies according to the design specifications, an allowable current for each secondary protection circuit must be able to accommodate a maximum current value. In FIG. 14, all of the secondary protection circuits 84 are designed to accommodate a current up to 27 mA.

In this case, an area efficiency is lowered. Additionally, when the areas of all of the secondary protection circuits 84 are preset to be small, the protection function provided by a secondary protection circuit 84 against specific ESD pulses is lost. Alternately, the protection at a maximum output current provided by the secondary protection circuit 84 is insufficient.

In contrast, in the IC structure shown in FIG. 15, in which one secondary protection circuit 84 is provided for each I/O cell 82, it is possible to obtain a maximum area efficiency.

Furthermore, as shown in FIG. 15, preinstalling a plurality of different types of secondary protection circuits 84 makes the device applicable to all types of anticipated ESD pulses. If the circuit path distances from each bonding pad 81 to the corresponding plurality of I/O cells 82 are not substantially the same, a plurality of the bonding pads 81 are connected by a common wide wiring pattern. In FIG. 15, elements A to L are each a different secondary protection circuit 84. All the different secondary protection circuits 84 are not necessarily different from each other. For example, the secondary protection circuits A and D may be the same type of protection circuit. A plurality of different types of the secondary protection circuits 84 makes it possible to combine necessary ones of the secondary protection circuits 84 according to a user's particular needs.

The structures shown in FIGS. 14 and 15 have been explained in connection with the first preferred embodiment, but they are the same in the second preferred embodiment.

This invention will be more fully understood from the detailed description given below and from the accompanying drawings, which are illustrative only, and thus are not to be considered as limiting this invention.

The full scope of this invention will become apparent from the following detailed description. However, it should be understood that the detailed description and specific examples, while indicating some preferred embodiments of this invention, are illustrative only, since various changes and modifications within the spirit and scope of this invention will be apparent to those skilled in the art from the detailed description.

BRIEF DESCRIPTION OF THE DRAWINGS

The preferred embodiments of this invention will be described in detail, with reference to the following figures, in which.

DETAILED DESCRIPTION OF THE INVENTION

Figure 16:
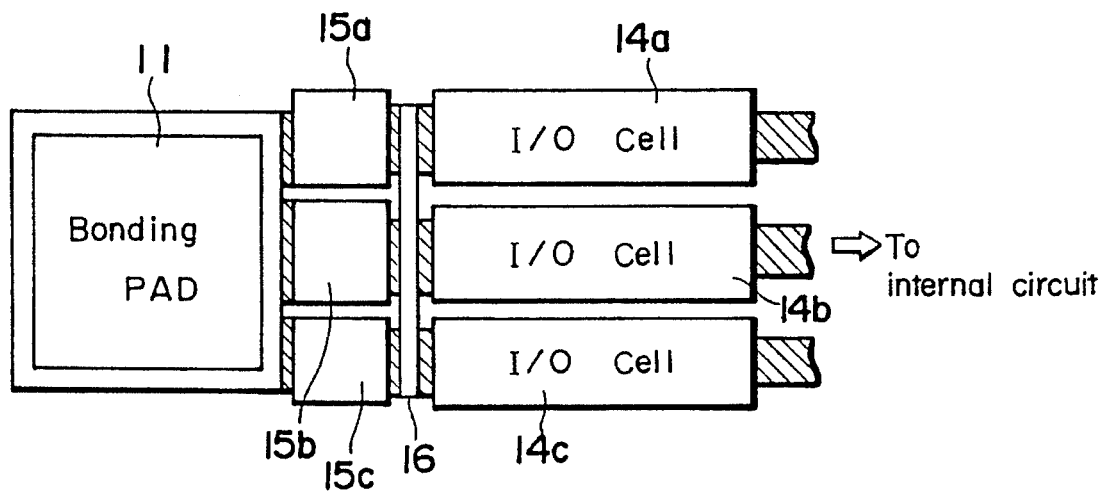
FIGS. 16 and 17 are top views of portions of a first preferred embodiment of the semiconductor integrated circuit of this invention.

FIG. 16 is a view of a portion of the semiconductor integrated circuit according to a first preferred embodiment of the protection structure of this invention. In FIGS. 16–21, the power supply means is not shown.

Between a bonding pad 11 and three I/O cells 14a–14c three secondary protection circuits 15a–15c are inserted in parallel relative to the bonding pad 11 and electrically connected to it. The respective secondary protection circuits 15a–15c may have different operational principles or they may be the same protection circuit.

In FIG. 16, the I/O cells 14a–14c are arranged in serial relative to a corresponding one of the secondary protection circuits 15a–15c. However, it is not technically essential that each secondary protection circuit 15 corresponds to one I/O cell 14.

Each secondary protection circuit 15a–15c is one (or more) of: a circuit, which, when an excessive positive voltage with respect to GND is input, reduces a value of the voltage; a circuit, which, when an excessive negative voltage with respect to GND is input, reduces a value of the voltage; and one of a plurality of switching devices having different parameters, such as operational conditions, time constants, ON resistance values, etc.

The wiring patterns between the secondary protection circuits 15a–15c and the I/O cells 14a–14c are shorted together with a conductive metal wire 16. When an excessive voltage, such as a voltage surge, is supplied to the secondary protection circuits 15a–15c, the secondary protection circuits 15a–15c reduce the voltage input to the bonding pad 11, and potential supplied to the I/O cells 14a–14c is the same because the secondary protection circuits 15a–15c are shorted by the metal wire 16 on their output side.

Accordingly, an excessive voltage is not supplied to one or more of the I/O cells 14, which would otherwise cause an electrostatic breakdown.

In this first preferred embodiment, as shown in FIG. 16, the wiring patterns between the secondary protection circuits 15a–15c and the I/O cells 14a–14c are shorted together by the conductive metal wire 16. However, the shorting means is not necessarily limited to the conductive metal wire 16. Instead, as shown in FIG. 17, wiring patterns for electrically connecting the secondary protection circuits 15a–15c to the I/O cells 14a–14c may be shorted together.

Figure 17:
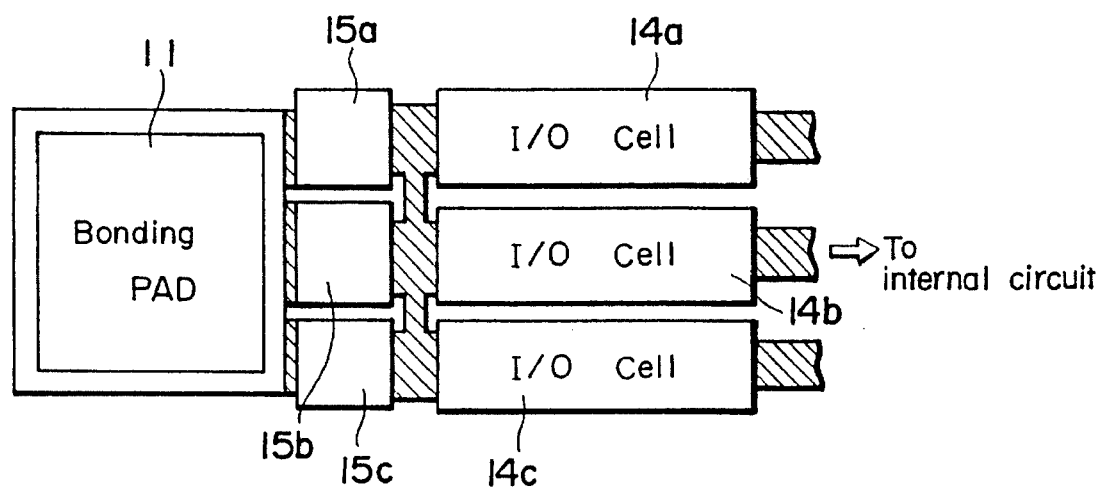

In the above-described first preferred embodiment, as shown in FIGS. 16 and 17, the power supply to the bonding pad may be made through first protection circuits from a power bus, as will be explained below.

In the wiring pattern of the above-described first preferred embodiment, as shown in FIGS. 16 and 17, a plurality of the secondary protection circuits 15 are individually connected to one bonding pad. However, the first preferred embodiment is not necessarily limited to this wiring pattern.

Figure 1:
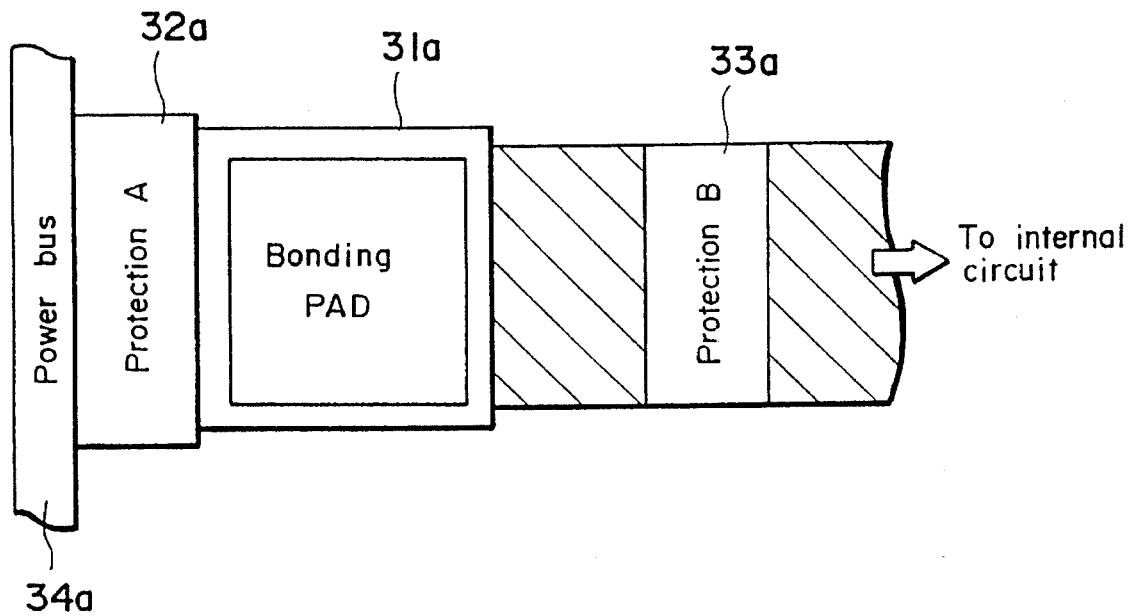
FIG. 1 is a top view of a portion of a first conventional semiconductor integrated circuit including a plurality of conventional protection circuits.
Figure 2:
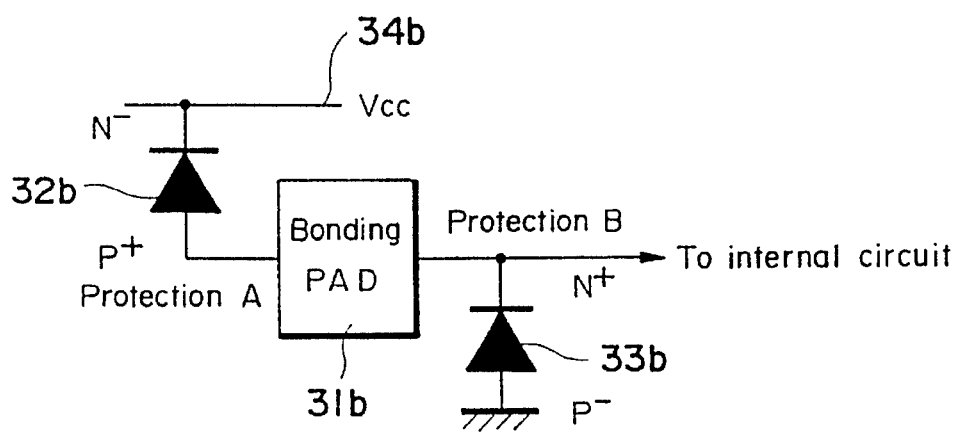
FIG. 2 is a circuit diagram of a circuit equivalent to the portion of the conventional semiconductor integrated circuit shown in FIG. 1.
Figure 3:
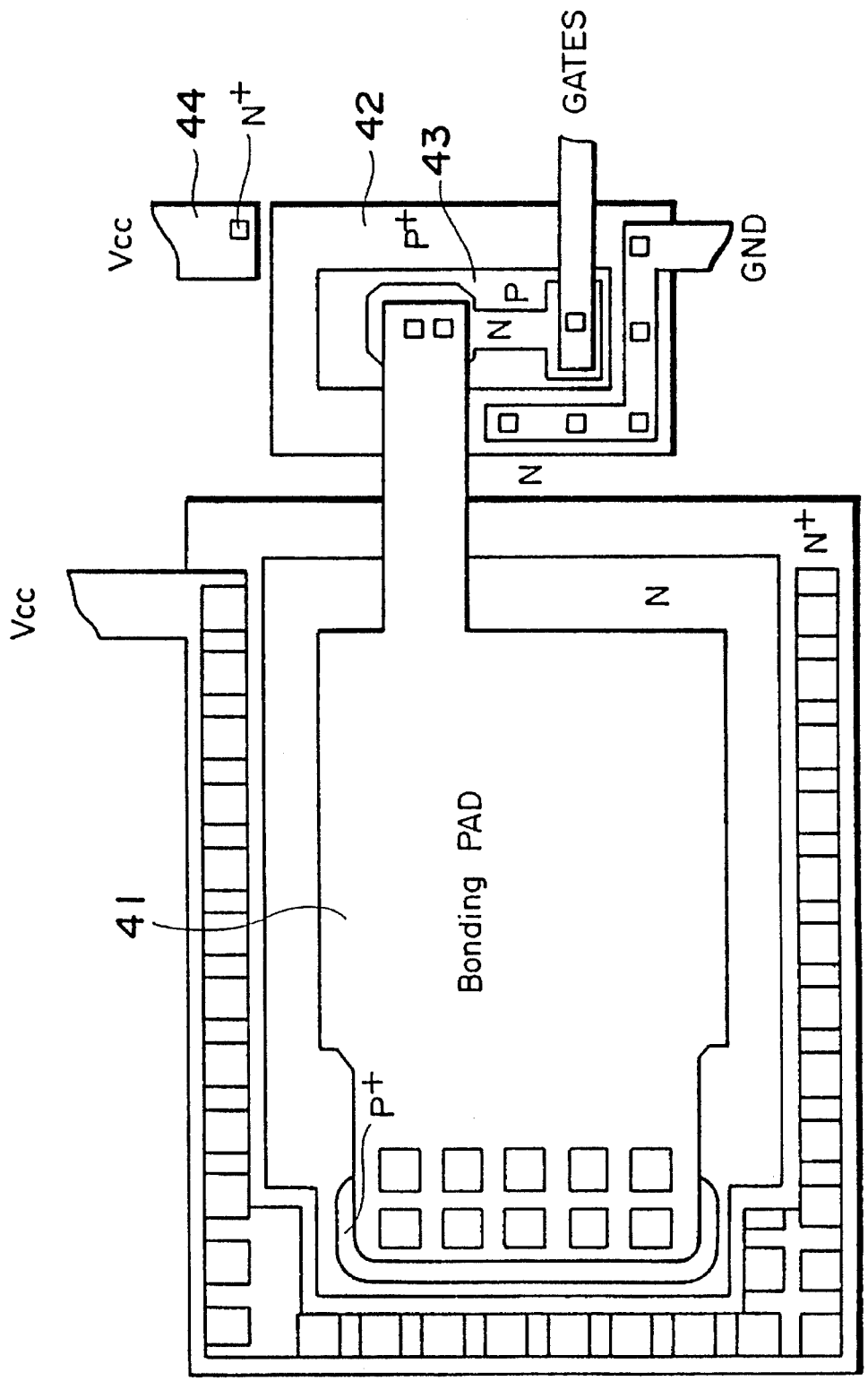
FIG. 3 is a top view of a portion of a second conventional semiconductor integrated circuit including a plurality of conventional protection circuits.
Figure 4:
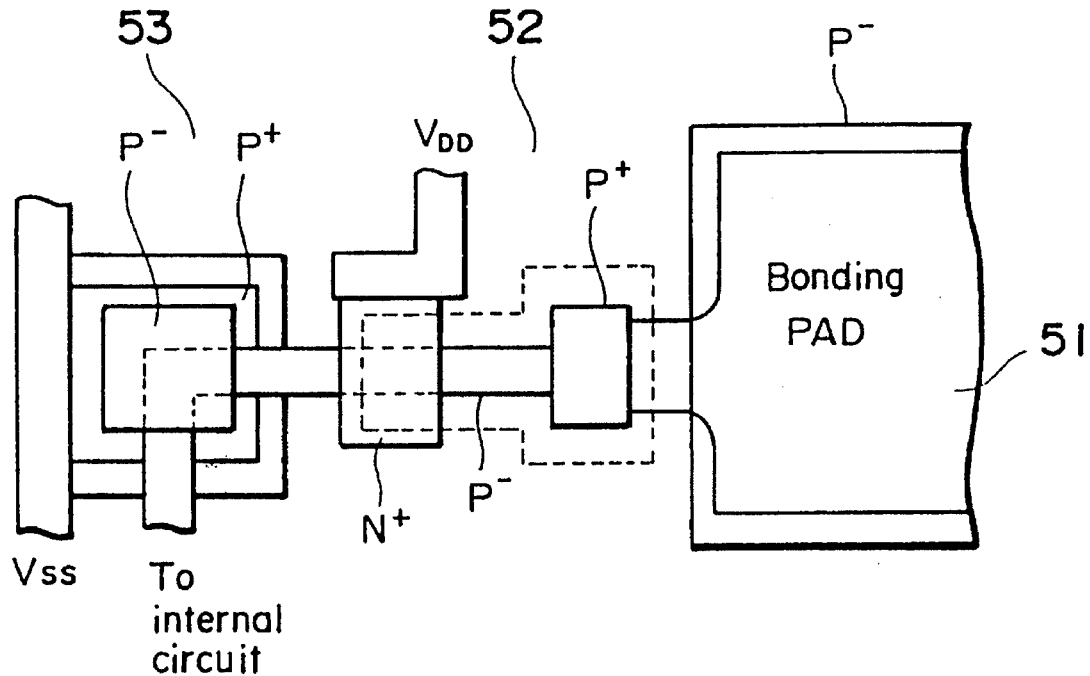
FIG. 4 is a top view of a portion of a third conventional semiconductor integrated circuit including a plurality of conventional protection circuits.
Figure 5:
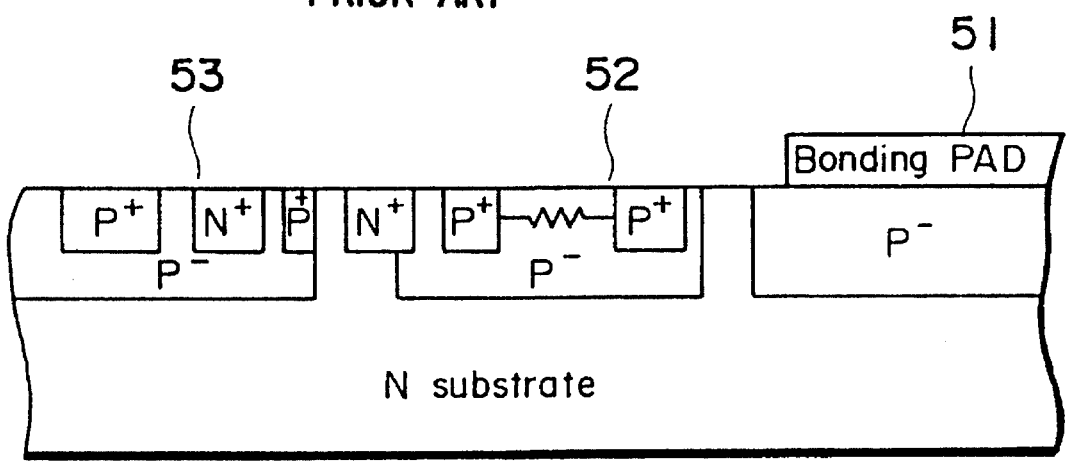
FIG. 5 is a cross-sectional view of the semiconductor integrated circuit shown in FIG. 4.
Figures 6, 7:
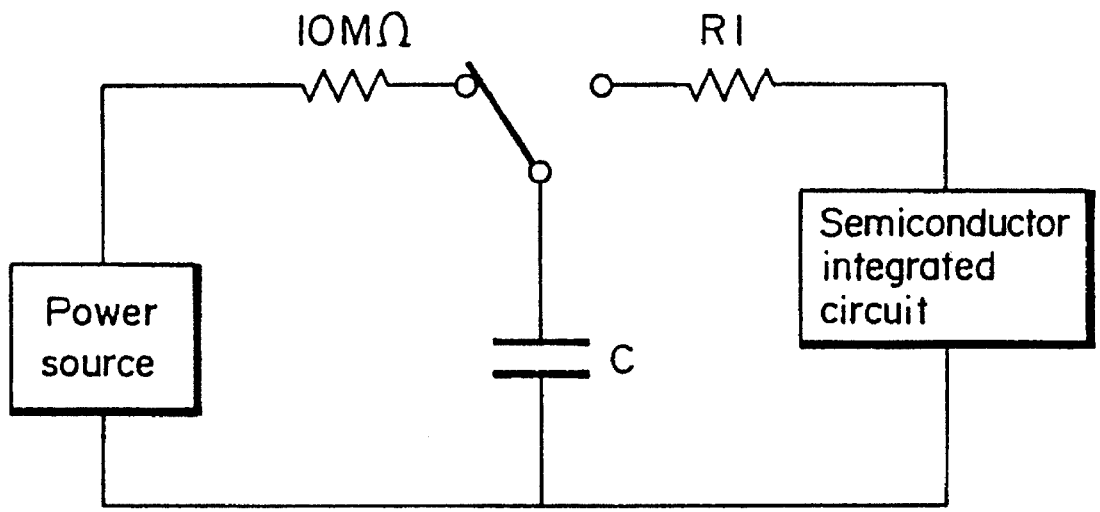
FIG. 6 is a circuit diagram of a typical device for conducting electrostatic breakdown voltage tests.
FIG. 7 is a table of measuring conditions for various electrostatic breakdown voltage tests using the device shown in FIG. 6.
Figure 8:
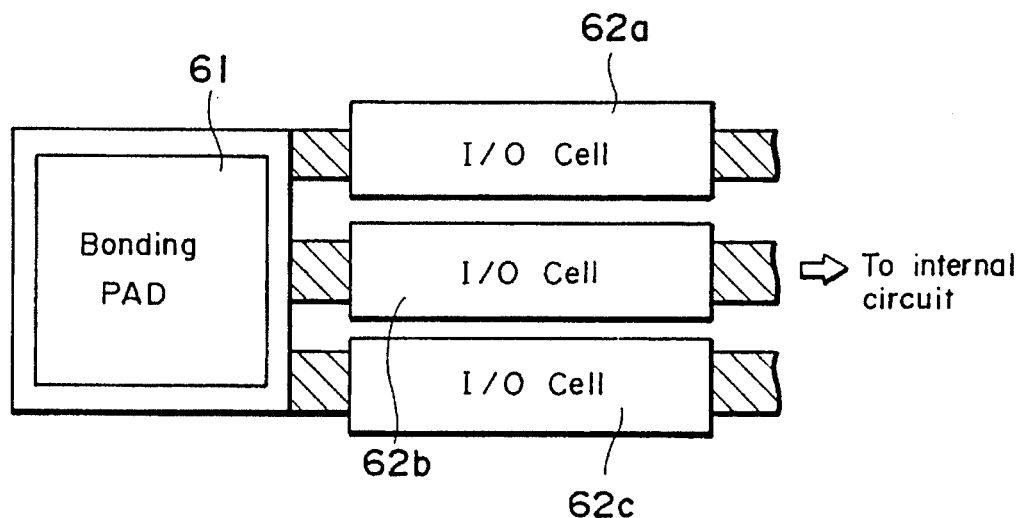
FIG. 8 is a top view of a portion of a first master slice-type semiconductor integrated circuit.
Figure 9:
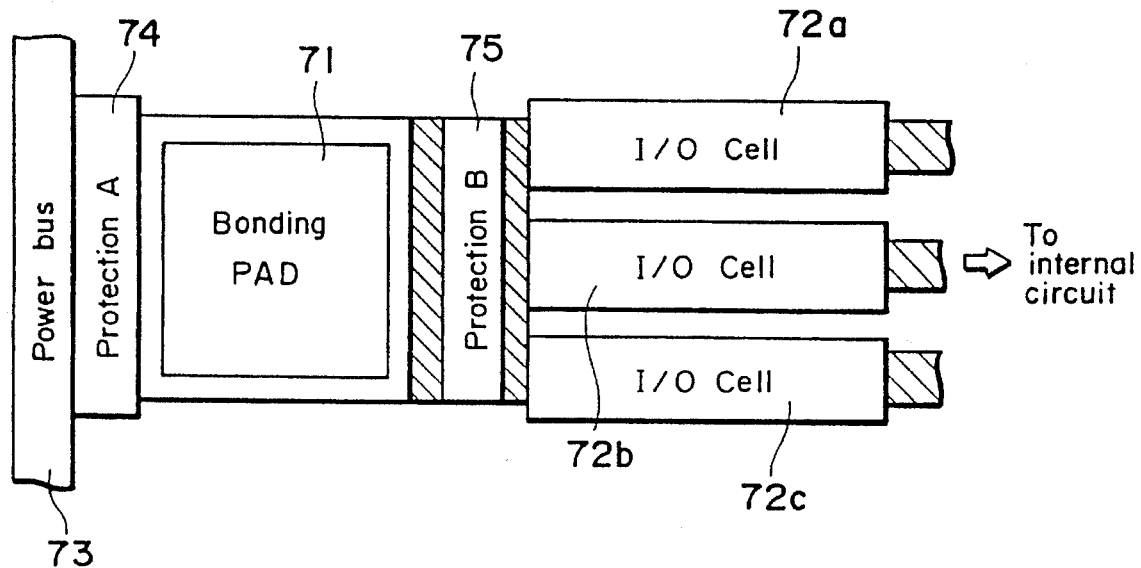
FIG. 9 is a top view of a portion of a second master slice-type semiconductor integrated circuit, including first and secondary protection circuits.
Figure 10:
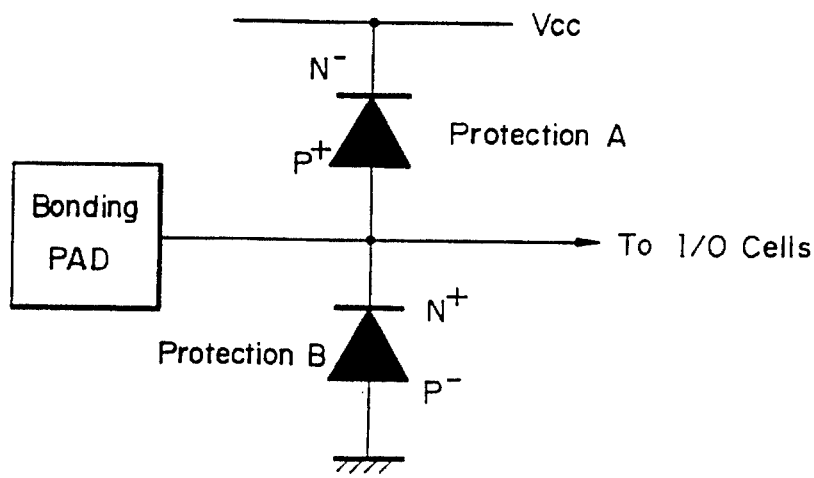
FIG. 10 is a circuit diagram of a semiconductor integrated circuit including two types of secondary protection circuits electrically connected in parallel to a bonding pad.
Figure 11:
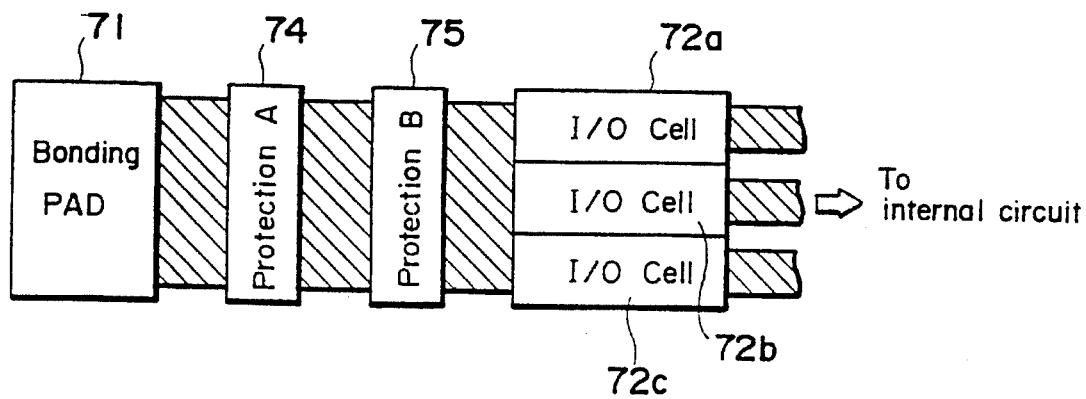
FIG. 11 is a top view of a semiconductor integrated circuit having two serially arranged secondary protection circuits.
Figure 12:
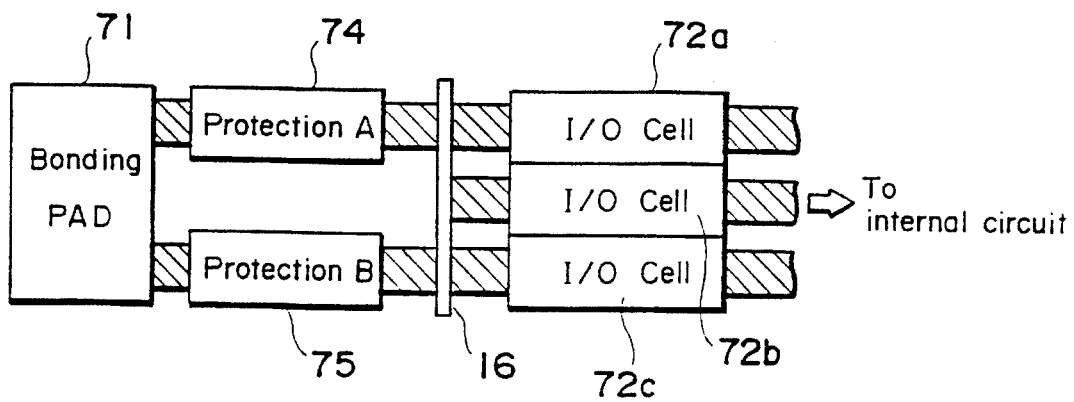
FIG. 12 is a top view of a semiconductor integrated circuit including two secondary protection circuits arranged in parallel relative to a bonding pad.
Figure 13:
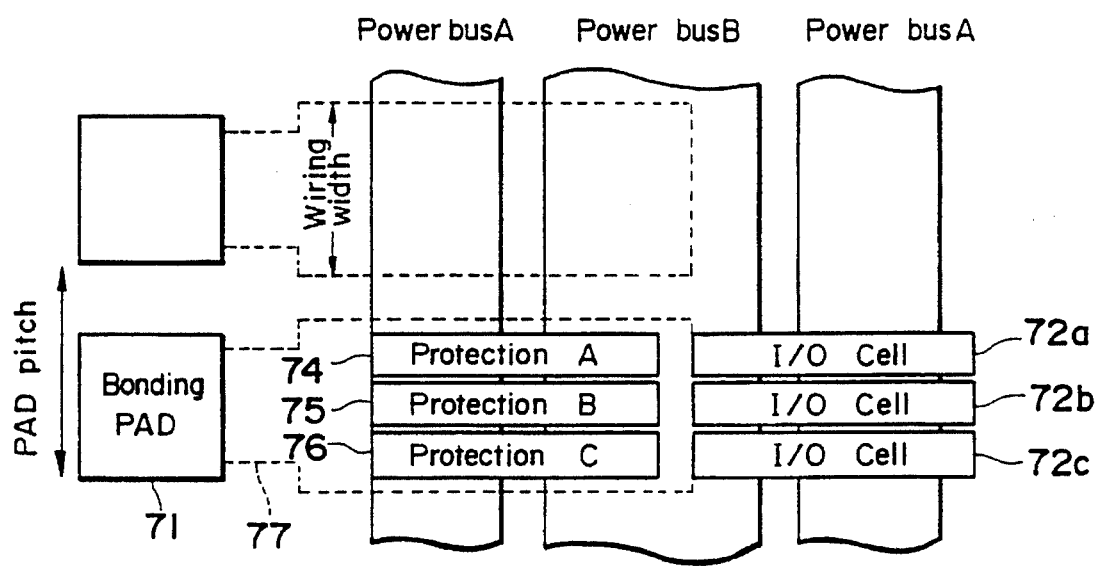
FIG. 13 is a view of a first wiring pattern between a bonding pad and a plurality of I/O cells.
Figure 14:
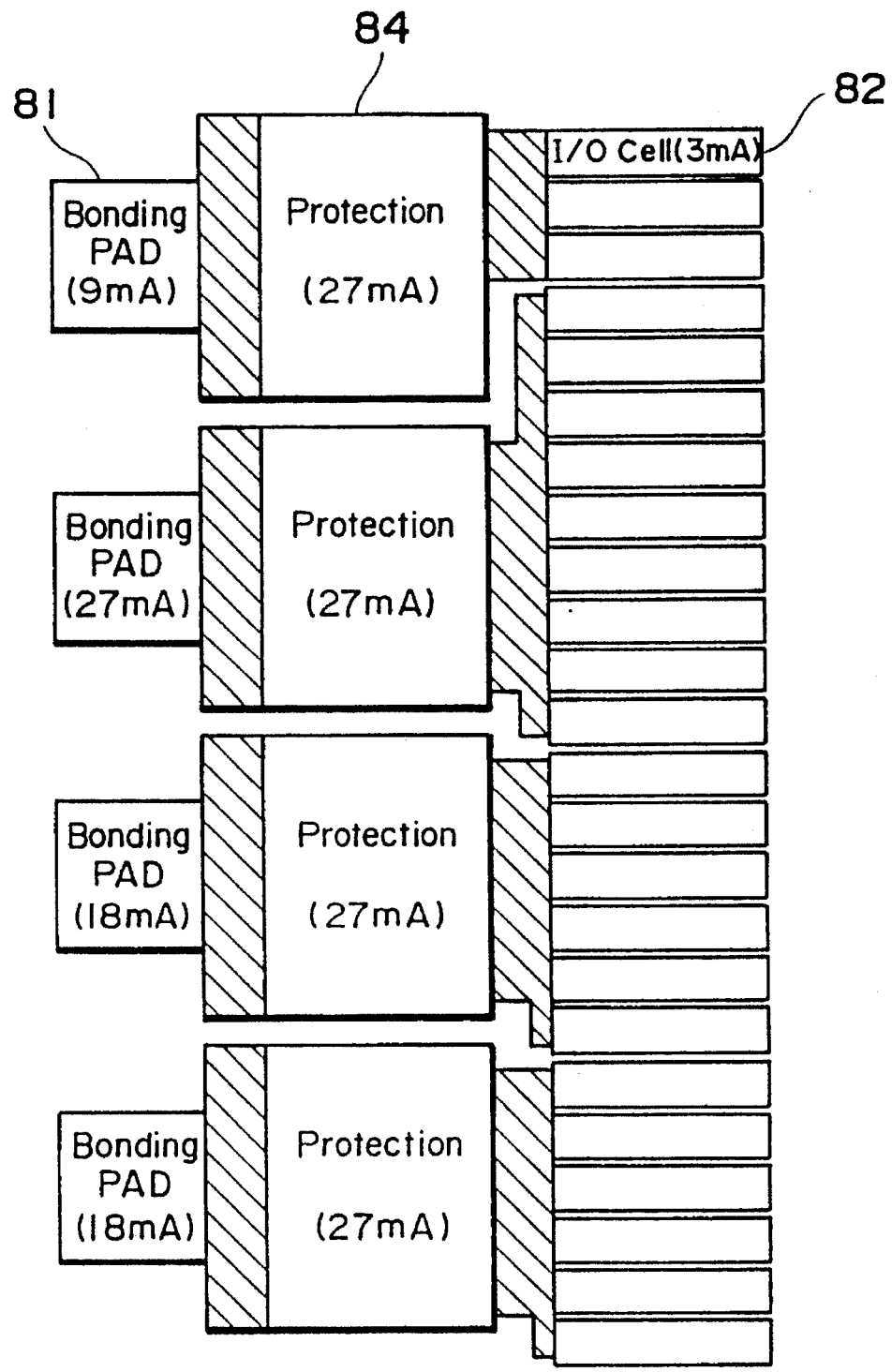
FIG. 14 is a top view of a semiconductor integrated circuit including one protection circuit corresponding to each of a plurality of I/O cells.

That is, as shown in FIG. 13, one bonding pad and the corresponding secondary protection circuits 15 may be connected by a common wide wiring pattern. This wiring produces the same effect as described above.

Figure 18:
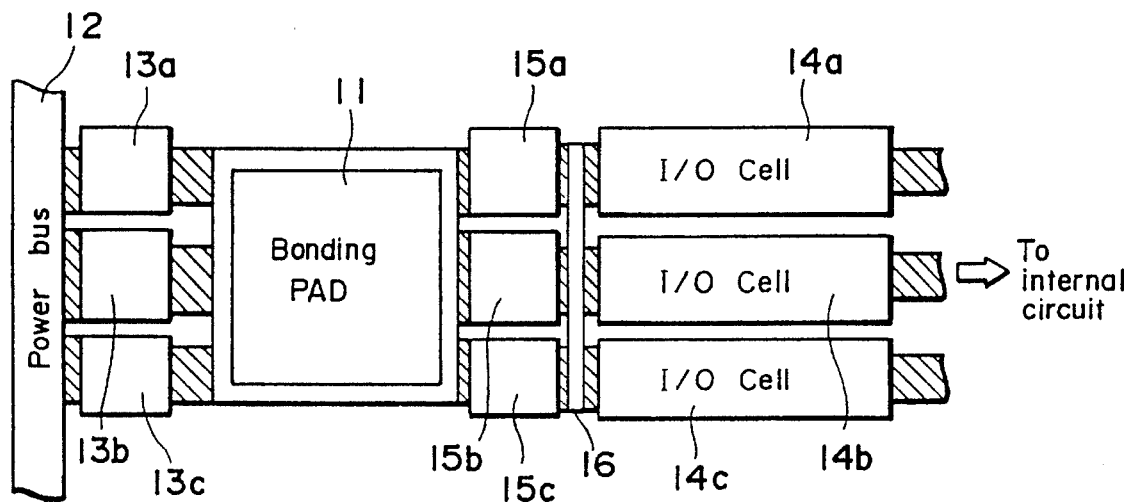
FIGS. 18 to 20 are top views of portions of a second preferred embodiment of the semiconductor integrated circuit of this invention.

On the other hand, FIG. 18 shows a second preferred embodiment of this invention, in which the power supply means for the bonding pad 11 is provided by connecting the power bus 12 to a metal wiring pattern (the power bus connecting the secondary protection is not shown). As shown in FIG. 18, three first protection circuits 13a–13c are inserted between the bonding pad 11 and the power bus 12 in parallel relative to the bonding pad 11. Three secondary protection circuits 15a–15c are inserted between the bonding pad 11 and three I/O cells 14a–14c in parallel relative to the bonding pad 11. The first protection circuits 13a–13b may be a combination of circuits which operate on different principles, or have different protection functions, or a combination of the same circuits. This is the same with the secondary protection circuits 15a–15c of the first, and the second, preferred embodiment.

As shown in FIG. 18, the same number of secondary protection circuits 15a–15c as the number of I/O cells 14a–14c are arranged in parallel. However, it is not technically essential that one I/O cell 14 correspond to one secondary protection circuit 15.

Each first protection circuit 13a–13c and each secondary protection circuit 15a–15c includes a circuit of at least one of the following types: a circuit, when an excessive positive voltage with respect to GND is input, reduces a value of the voltage; a circuit, which, when an excessive negative voltage with respect to GND is input, reduces a value of the voltage; and one of a plurality of switching devices having different parameters (or device characteristics), such as operational conditions, time constants, ON resistance values, etc.

The wiring patterns between the secondary protection circuits 15a–15c and the I/O cells 14a –14c are shorted together by a conductive metal wire 16. When an excessive voltage signal, such as a voltage surge or the like, is supplied to the input side of the bonding pad 11, first, the first protections 13a–13c operate to form a path of low impedance between the power source bus and the bonding pad 11.

If the protection provided by the first protection circuits 13 is insufficient, the secondary protection circuits 15a–15c operate to reduce the voltage on the bonding pad 11. But the I/O cells 14a–14c each have the same resulting potential, because the wiring patterns between the secondary protection circuits 15a–15c and the I/O cells 14a–14c are shorted together by the conductive metal wire 16. Thus, an excessive voltage is not supplied to certain ones of the I/O cells, and an electrostatic breakdown does not happen.

Figure 19:
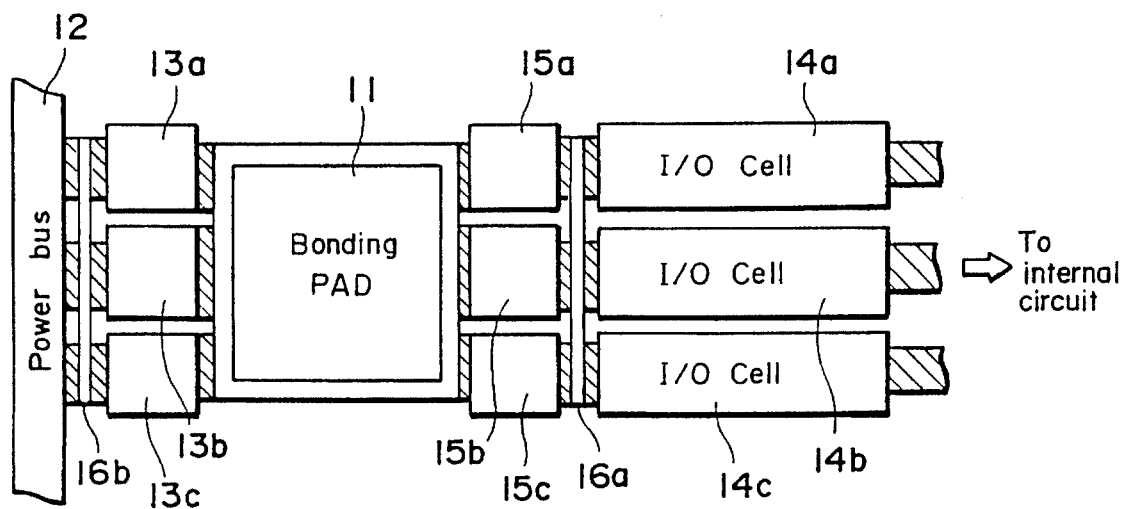

FIG. 19 shows, for example, an application of the second preferred embodiment of this invention shown in FIG. 18. That is, the conductive metal wire 16 (i.e. element 16a of FIG. 19) is provided on the I/O cell side of the secondary protection circuits 15a–15c. In addition, a conductive metal wire 15 (i.e. element 16b of FIG. 19) is provided on the power bus side of the first protection circuits 13a–13c.

Figure 20:
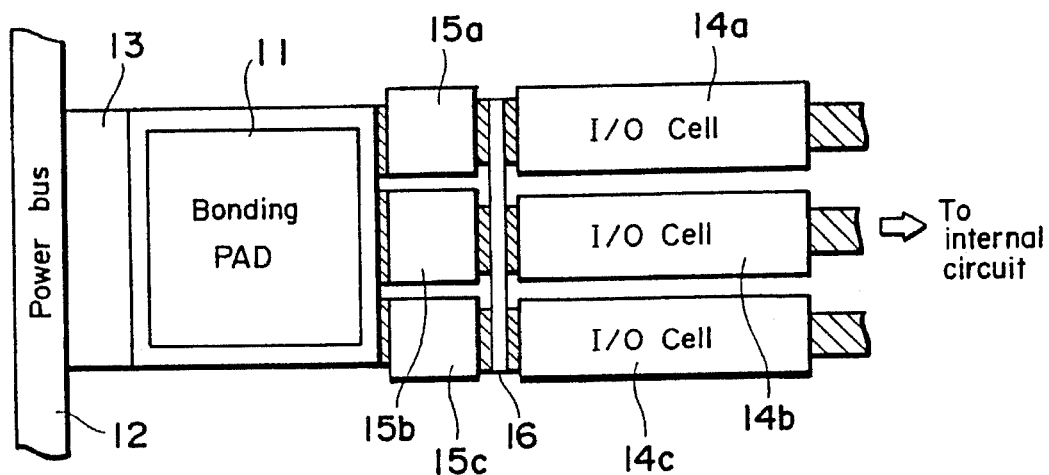

When sufficient protection can be obtained with only the secondary protection circuits 15a–15c, the first protection circuits 13a–13c may be omitted, or replaced with a single protection circuit 13, as shown in FIG. 20.

The wiring patterns may also be provided by a wide wiring pattern which is common to the respective protections.

The second preferred embodiment of this invention, as shown in FIGS. 18 and 19, is effective when the first protection circuits 13 are provided by thyristors, which act as low speed devices to absorb large energy surges and the secondary protection circuits 15 are provided by diodes, which act as high speed devices.

Figure 21:
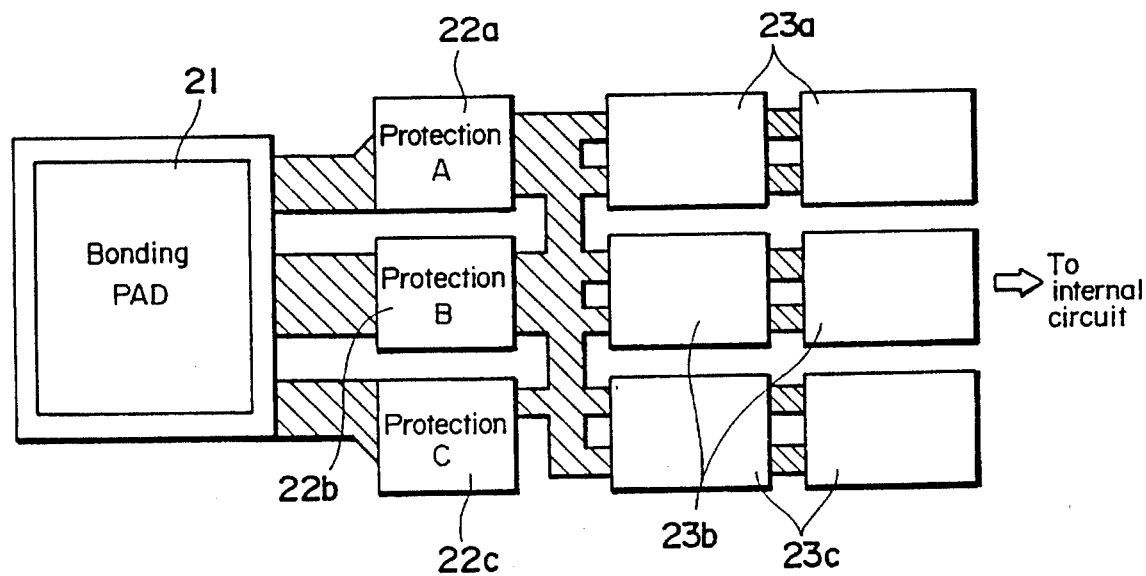
FIG. 21 is a detailed top view of a portion of the first preferred embodiment of the semiconductor integrated circuit of this invention.

A more specific application of the preferred embodiments of this invention will be explained with reference to FIG. 21. FIG. 21 shows a detailed top view of the first preferred embodiment of FIG. 17. The power supply means is not shown in FIG. 21.

In FIG. 21, a first type of protection circuit 22a (the protection circuit A of FIG. 21) is provided by a n$^+$/p-diode, and a second type of protection circuit 22b (the protection circuit B of FIG. 21) is provided by a p$^+$/n-diode. A third type of protection circuit 22c (the protection circuit C of FIG. 21) is provided by a thyristor. The I/O cells 23a–23c act as output buffers and are provided by a nMOS-FET or a PMOS-FET. In this preferred embodiment, when a negative electrostatic pulse is applied to the bonding pad 21, the first type of protection circuit 22a turns on. The second type of protection circuit 22b turns on when a positive electrostatic pulse is applied to the bonding pad 21. Thus, a voltage applied to the bonding pad 21 is decreased, and voltages to be supplied to the respective I/O cells 23a–23b are brought to a normal level.

When a pulse which cannot be accommodated by either the first type of protection circuit 22a or the second type of protection circuit 22b is supplied to the bonding pad 21, the third type of protection circuit 22c operates. Since the ON resistance value of the thyristor forming the third type of protection circuit 22c is low, the energy of the pulse is absorbed, and voltages to be supplied to the I/O cells 23a–23c are sufficiently reduced.

In FIGS. 16 to 21, three I/O cells, three first protection circuits 13, and three secondary protection circuits 15 are provided. However, the number of the first protection circuits 13 and the second protection circuits 15 may be larger than the number of the I/O cells 14.

Based on the principle of this invention, in addition to the two types of diodes and the thyristor, switching devices having various operational conditions and parameters can be also used. Accordingly, a semiconductor integrated circuit, which is adaptable to both the EIAJ method and the MIL standard method mentioned above, can be fabricated. Taking into consideration the waveforms having large pulse widths and high voltage values used in the MIL standard method, field-type MOS transistors, as the first and/or secondary protection circuits, may be connected to the bonding pad. Taking into consideration the waveforms having small pulse widths and voltage values of some hundreds, thyristers or diodes, as the first and/or secondary protection circuits, may be connected to the bonding pad.

This invention is characterized in that a plurality of types of protection circuits can be included. This makes it possible to keep a library of protection circuits which are adaptable to special ESD pulses to select particular protection circuits according to users' specifications to form customized semiconductor integrated circuits.

As seen from the above description, the semiconductor integrated circuit according to this invention can accommodate a number of protection circuits as far as an area permits when a number of I/O cells have to be increased, but with the conventional problem of insufficient electrostatic breakdown prevention successfully overcome.

Specifically, respective protection circuits are arranged in parallel with respect to one bonding pad, and the I/O cell sides of the protection circuits are shorted together. Accordingly, the path distance from the bonding pad to each of the respective protection circuits is substantially the same. Thus, propagation times of ESD pulses to the respective protection circuits is uniform. Accordingly, all kinds of pulses can be concurrently attenuated, and the protecting ability is improved. Even when a supplied current has a value which can be accommodated by one I/O cell, a plurality of protection circuits are connected to the bonding pad and to the respective I/O cells and can be clamped.

Figure 15:
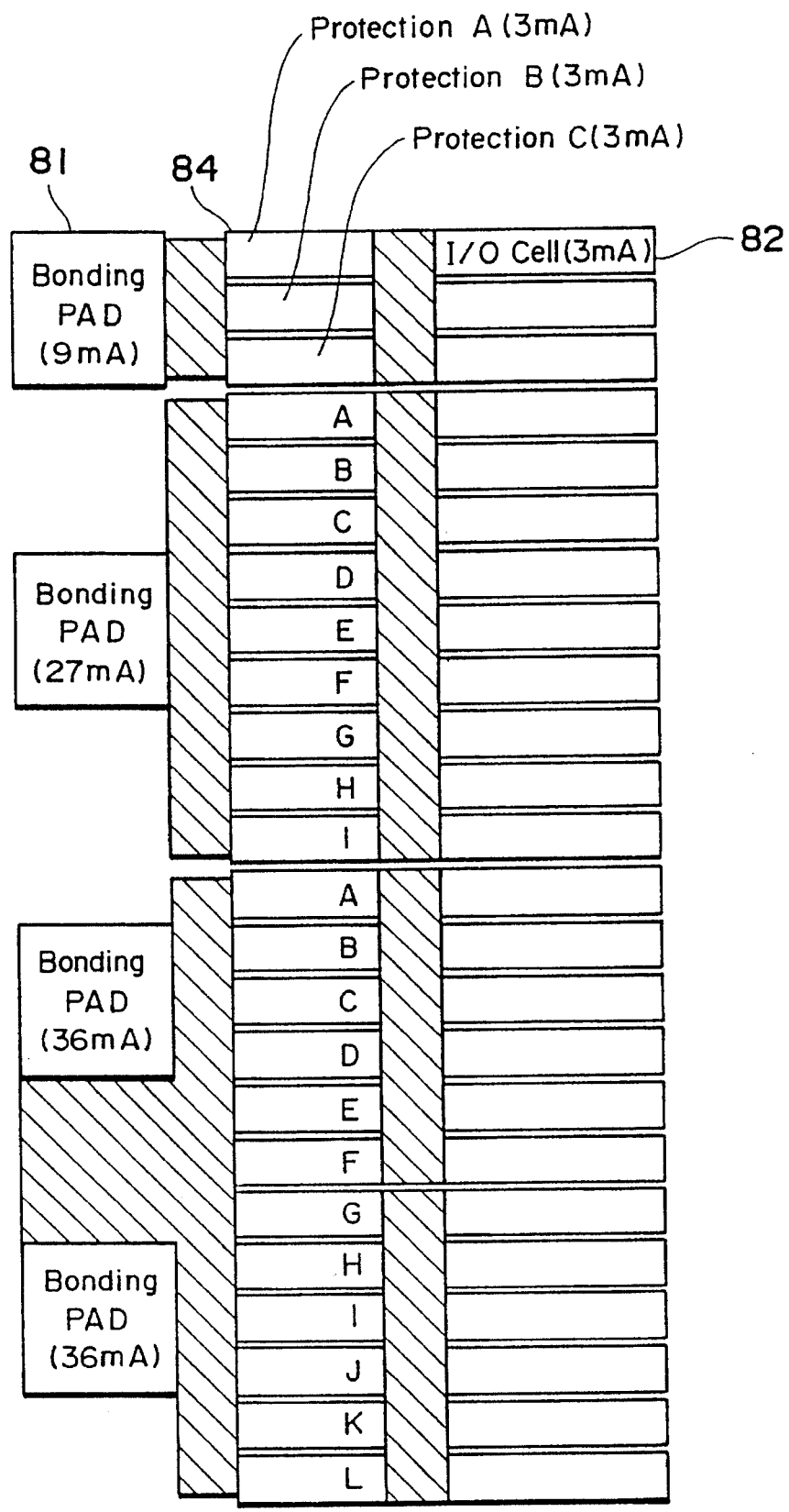
FIG. 15 is a top view of a semiconductor integrated circuit including a plurality of protection circuits corresponding to each of a plurality of I/O cells.

According to this invention, in diminishing a bonding pad pitch, the custom LSIs need not be redesigned to reduce a gap between the respective protection circuits (or a width of the respective protection circuits) and a gap can be reduced only by making changes to the wiring patterns without making changes to the protection circuits (FIG. 15).

Even in the case that one I/O cell is provided for each protection circuit and the I/O cells are connected in parallel to one bonding pad, whereby an increased output current can be obtained, a total area of the respective protection circuits is increased in accordance with an increased number of the I/O cells, and the protection ability is accordingly improved. As a result, the respective I/O cells are free from damages due to excessive currents.

Conversely, according to this invention, it is not necessary to provide a large area for a protection circuit. Accordingly, a much higher area efficiency than in the conventional device can be obtained.

Furthermore, mutually compensating circuits, such as switching devices having different operation conditions, can be used as the protection circuits and can be arranged together with the I/O cells and connected in parallel to one bonding pad. Accordingly, electrostatic pulses generated under complicated conditions can be effectively absorbed. Breakdowns and deterioration of the semiconductor integrated circuits caused by transient phenomena of high voltages due to static discharges or excessive currents can be avoided.

The protecting circuits involved in this invention are especially effective in semiconductor circuits having slice type-I/O cells, but are also effectively applicable to widely used general semiconductor integrated circuits.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit including at least one input/output circuit, each at least one input/output circuit comprising:

a bonding pad;

a plurality of input/output cells;

at least one wiring pattern extending between the bonding pad and the plurality of input/output cells, the at least one wiring pattern electrically connecting each of the plurality of input/output cells to the bonding pad; and a plurality of protection circuits, the plurality of protection circuits including at least two types of protection circuits;

wherein each of the plurality of protection circuits is electrically connected to the at least one wiring pattern at a point between the bonding pad and the plurality of input/output cells, such that a propagation time of an excessive voltage pulse from the bonding pad to each of the plurality of protection circuits is substantially the same.

2. A semiconductor integrated circuit according to claim 1, wherein:

the at least one wiring pattern comprises a plurality of wiring patterns, each one of the plurality of wiring patterns electrically connects each one of the input/output cells to the bonding pad, and each one of the plurality of protection circuits is electrically connected to a corresponding one of the plurality of wiring patterns.

3. A semiconductor integrated circuit according to claim 1, wherein the at least one wiring pattern is a single common wiring pattern connecting each of the plurality of input/output cells to the bonding pad, and each of the plurality of protection circuits is electrically connected to the single common wiring pattern.

4. A semiconductor integrated circuit including at least one input/output circuit, each input/output circuit comprising:

a bonding pad;

a plurality of input/output cells spaced from the bonding pad along a propogation direction, each of the plurality of input/output cells electrically connected to the bonding pad; and a plurality of protection circuits, each of the plurality of protection circuits electrically connected to the bonding pad, the plurality of protection circuits including at least two types of protection circuits;

wherein the plurality of protection circuits are arranged between the bonding pad and the plurality of input/output cells and are spaced from each other along a second direction generally perpendicular to the propogation direction, such that a propagation time of an excessive voltage pulse from the bonding pad to each of the plurality of protection circuits is substantially the same.

5. A semiconductor integrated circuit including at least one input/output circuits, each at least one input/output circuit comprising:

a bonding pad;

a plurality of input/output cells, each of the plurality of input/output cells being electrically connected to the bonding pad; and a plurality of protection circuits, each of the plurality of protection circuits being electrically connected to the bonding pad, the plurality of protection circuits including at least two types of protection circuits;

wherein the plurality of protection circuits are arranged between the bonding pad and the plurality of input/output cells such that each one of the protection circuits is parallel to the other ones of the protection circuits, each of the protection circuits facing a common side of the bonding pad and a propagation time of an excessive voltage pulse from the bonding pad to each of the plurality of protection circuits is substantially the same.

6. A semiconductor integrated circuit formed on a surface of a semiconductor substrate, including at least one input/output circuit, and comprising:

a plurality of bonding pads generally linearly arranged in a first column on the semiconductor substrate;

a plurality of input/output cells generally linearly arranged in a second column on the semiconductor substrate, the second column being substantially parallel to the first column; and a plurality of protection circuits generally linearly arranged in a third column on the semiconductor substrate between the plurality of bonding pads and the plurality of input/output cells, the third column being substantially parallel to the first column, the plurality of protection circuits including at least two types of protection circuits;

wherein each one of a plurality of sets of the input/output cells and each one of a corresponding plurality of sets of the protection circuits are electrically connected to one of the plurality of bonding pads, to form an input/output circuit, each of the sets of input/output cells comprises at least two of the plurality of input/output cells and each of the corresponding sets of protection circuits comprises at least one of each of the at least two types of protection circuits.

7. A semiconductor integrated circuit according to claim 6, wherein the plurality of input/output cells comprises at least two of the input/output cells for each of the plurality of bonding pads, and the plurality of protection circuits comprises at least two of the protection circuits for each of the plurality of bonding pads.

8. A semiconductor integrated circuit according to claim 7, wherein the at least two of the protection circuits comprises at least one of each of the at least two types of protection circuits.

9. A semiconductor integrated circuit according to claim 7, wherein one of the plurality of protection circuits is provided for each one of the plurality of input/output cells.

10. A semiconductor integrated circuit according to claim 6, wherein each of the sets of protection circuits comprises contiguously adjacent ones of the plurality of protection circuits.

11. A semiconductor integrated circuit according to claim 6, wherein a number of the input/output cells in a first one of the sets of input/output cells is different from a number of input/output cells in a second one of the sets of input/output cells.

12. A semiconductor integrated circuit according to claim 6, wherein a propagation time of an excessive voltage pulse from the bonding pad to each of the protection circuits within a corresponding one of the sets of protection circuits is substantially the same.

* * * * *